United States Patent [19]

Takeuchi et al.

[11] Patent Number: 4,582,768
[45] Date of Patent: Apr. 15, 1986

[54] METHOD FOR FORMING REGISTER MARKS

[75] Inventors: Hideo Takeuchi, Shiroi; Michiaki Kobayashi, Kitamoto; Hiroyuki Hashimoto; Daiji Suzuki, both of Tokyo, all of Japan

[73] Assignee: Dai Nippon Insatsu Kabushiki Kaisha, Tokyo, Japan

[21] Appl. No.: 716,822

[22] Filed: Mar. 27, 1985

Related U.S. Application Data

[63] Continuation of Ser. No. 518,933, Aug. 1, 1983, abandoned.

[30] Foreign Application Priority Data

Aug. 7, 1982 [JP] Japan ................. 57-137618

[51] Int. Cl.$^4$ .................. G03F 9/00; B41M 1/14; G01B 11/16; G01N 33/48
[52] U.S. Cl. .................. 430/22; 101/135; 101/211; 101/DIG. 12; 355/40; 355/52; 355/53
[58] Field of Search ............. 430/22; 355/52, 40, 355/53; 101/135, 211, DIG. 12

[56] References Cited

U.S. PATENT DOCUMENTS 3,904,291 9/1975 Webster ................. 355/40
3,907,425 9/1975 Isamu et al. ............ 355/40
4,179,990 12/1979 Radencic ............... 430/22

Primary Examiner—Richard L. Schilling
Attorney, Agent, or Firm—Koda and Androlia

[57] ABSTRACT

A method for forming or marking register marks used for the automatic registration between a plurality of printing plates in a printing press. A register mark forming or marking device is mounted on a printing frame of an automatic composer so that a register mark can be formed or marked on a printing plate simultaneously with the printing of a film original over the printing plate. Misalignment between the thus formed or marked register marks and patterns or images can be eliminated.

5 Claims, 16 Drawing Figures

METHOD FOR FORMING REGISTER MARKS

This is a continuation of application Ser. No. 518,933, filed Aug. 1, 1983, now abandoned.

BACKGROUND OF THE INVENTION

The present invention relates to a method for forming register marks which are used to attain automatic registration between a plurality of printing plates on an offset printing press.

Heretofore, various methods for making automatic corrections of misregistration by reading register marks formed or marked on printing plates or printed sheets in the case of printing by an offset printing press have been proposed, but the problem of maintaining a correct positional relationship between a register mark and a pattern or image to be printed has not yet been solved. As a result, automatic correction of misregistration or misalignment has been practically impossible.

For instance, a method in which in addition to a film original for printing a pattern or image, a film original bearing a register mark is provided, and, prior to or after the pattern or image is printed, the film original bearing a register mark is aligned with the film original bearing a pattern or image by a pin-and-hole registration or alignment method has been proposed and demonstrated. This method has a serious drawback in that a register mark and a pattern or image to be printed are not correctly registered or aligned with each other.

Another method in which, prior to or after a pattern or image is printed, a film original bearing a register mark is set on a printing plate in a composer (step and repeat machine) so that a register mark is printed or otherwise formed on a printing plate in a manner substantially similar to that in which a pattern or image is printed has also been proposed. This method is advantageous over the first-mentioned method in that a register mark can be printed or otherwise formed at a specific position with a high degree of accuracy, but it has a disadvantage in that since register marks must be printed or otherwise formed on both sides of a printing plate, additional printing operation for printing two register marks is necessary.

In general, the composer prints four to eight patterns or images on a single printing plate so that the efficiency of the composer is adversely affected when two additional register marks are printed or otherwise formed.

SUMMARY OF THE INVENTION

In view of the above described deficiency in the prior art, one of the objects of the present invention is to provide a method for forming or marking register marks which can eliminate the misregistration or misalignment between register marks and patterns or images to be printed.

Another object of the present invention is to provide a method for forming or marking register marks which can print or otherwise form register marks on a printing plate without causing a decrease in the efficiency of a composer.

A further object of the present invention is to provide a method for forming or marking register marks which can ensure correct automatic registration between a plurality of color printing plates in a color offset printing press.

According to the present invention, there is provided a method for forming or marking register marks characterized by the procedure of mounting a register mark forming or marking device on a head of a composer which is provided with a printing frame, and forming or marking a register mark on a printing plate when a film original mounted on the printing frame is printed on the printing plate clamped over a table of the composer, the register marks being used for the automatic registration between a plurality of printing plates on a printing press.

The above and other objects, effects and features of the present invention will become more apparent from the following description of preferred embodiments thereof when taken in conjunction with the accompanying drawings.

BRIEF DESCRIPTION OF THE DRAWINGS

In the drawings:

FIG. 3($b$) is a side view of the same device when it is in operative position;

DETAILED DESCRIPTION OF THE INVENTION

Figure 1:
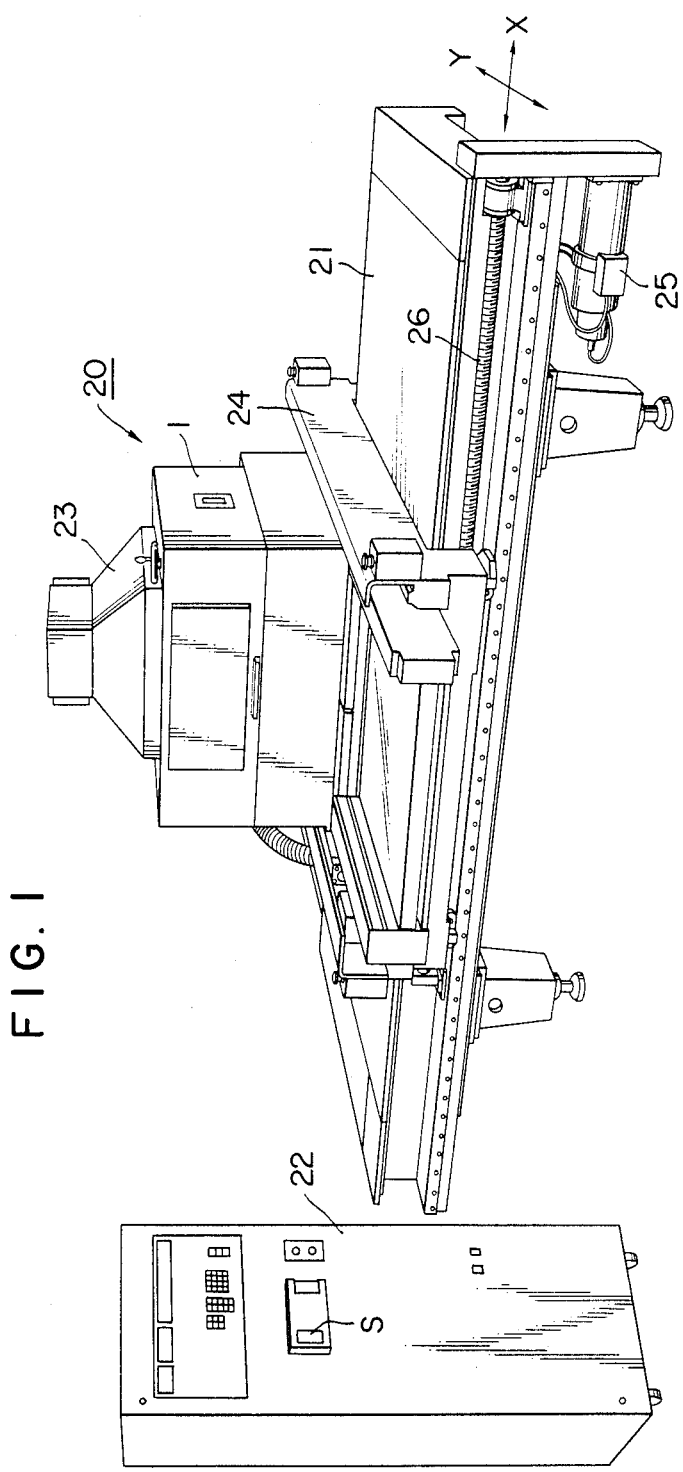
FIG. 1 is a perspective view of an automatic composer.

In FIG. 1 is shown an automatic composer or step and repeat machine 20 comprising essentially a horizontal supporting table 21, a printing head 1 movable in horizontally orthogonal X- and Y-directions over the supporting table 21, and a control unit 22 for controlling the movement of the printing head 1. The printing head 1 includes a light source 23 and rides on a movable frame 24 for the movement in the Y-direction. The movable frame 24 is movable in the X-direction with respect to the supporting table 21 as a lead screw 26 is rotated by a motor 25.

Figure 2:
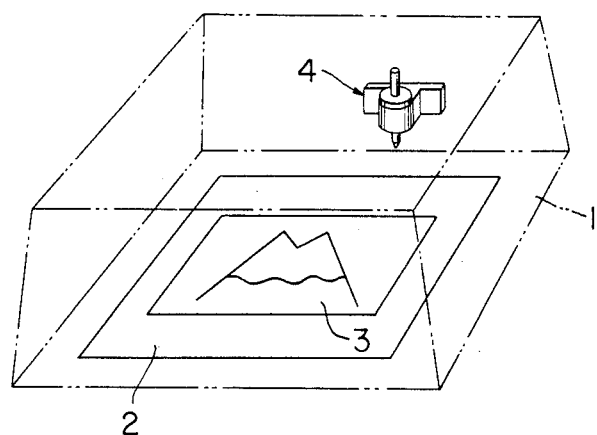
FIG. 2 is a schematic view of a head of a composer.

As shown in FIG. 2, a film original holder 2 is mounted on the bottom of the head 1 for holding a film original 3. The head 1 sequentially prints patterns over a printing plate securely clamped over the supporting table 21.

Figure 3A:
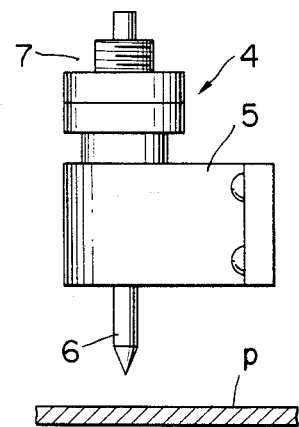
FIG. 3($a$) is a side view of a register mark forming or marking device when the device is in inoperative position.
Figure 3B:
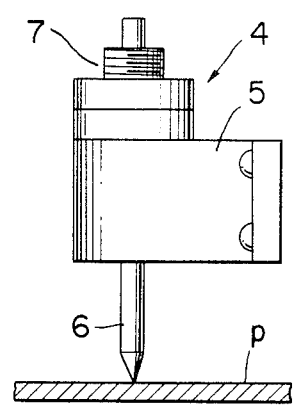

A register mark forming device 4 is mounted on the head 1 at a suitable position (on a side wall of the head 1 shown in FIG. 2). As best shown in FIG. 3($a$), the register mark forming device 4 has a stationary frame 5, a vertically movable scribing stylus 6 and an electromagnetic solenoid 7 for causing the vertical movement of the scribing stylus 6. When the solenoid 7 is energized, the scribing stylus 6 is lowered and placed into contact with the printing plate P over the supporting plate 21 as best shown in FIG. 3(b).

Figure 4:
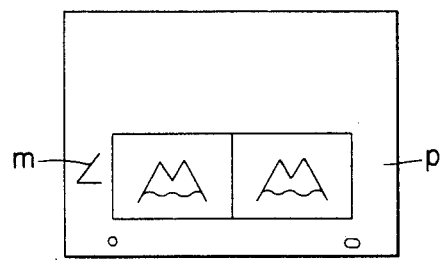
FIGS. 4, 5 and 6 are planar views showing patterns or images printed on a printing plate.
Figure 5:
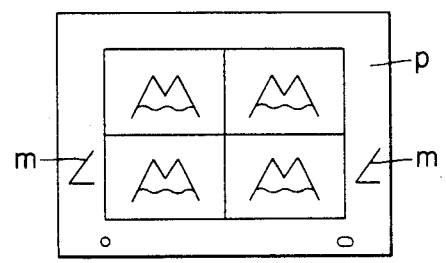

Next the printing operation will be described. First, the original 3 is mounted on the holder 2 and the printing plate P is clamped over the surface of the horizontal supporting table 21. A punched card (not shown) which indicates the printing positions is inserted into a slit S of the control unit 22. In response to the information derived from the punched card, the original holder 2 is displaced so that patterns are sequentially printed as shown in FIG. 4. A register mark is formed when the register mark forming device 4 passes a predetermined position where a register mark is to be formed when the holder 2 is displaced. More particularly, when the register mark forming device 4 is moved immediately above a predetermined position, the solenoid 7 is energized so that the scribing stylus 6 is lowered and placed into contact with the printing plate P, whereby as the head 1 is displaced, a ∠-shaped register mark m is formed. As described above, in order to improve the efficiency of the composer, it is preferable to mark the register mark m while a pattern or image is being printed. However, the register mark m may be marked prior to or after the printing of a pattern. Thus two register marks m are respectively marked on two sides of the printing plate as best shown in FIG. 5.

In general, a printing plate comprises a grained aluminum plate coated with a photosensitive resin (photopolymer) layer or film. The right and left portions of the printing plate where the register marks m are to be marked are exposed during or after printing (only in the case of a positive printing plate) in order to remove the photosensitive resin layer or film after the development. Thus, the grained aluminum surface (non-image area) appears or is exposed. When the scribing stylus 6 is used to mark the register marks m at these portions in accordance with the present invention, both the photosensitive resin layer and the grained aluminum surface are scribed off so that lustrous aluminum surfaces are exposed. As a result, the registration marks m have a higher degree of reflectivity as compared with the grained aluminum surface, whereby they can be positively detected by optical sensors. In order to remove the photosensitive resin layer or film and the grained aluminum surface, the surface of the printing plate is cut or ground.

According to the present invention, a film original is prepared by the reproduction step, and, during the composition step, in which the film original is printed by an automatic composer, the printing and the marking of the register marks are simultaneously carried out by the mechanisms incorporated into a single device. Thereafter, the registration is conducted by utilizing the register marks as references. Therefore, when the register marks are marked during the composition step, relative misalignment between the register marks and the patterns or images of respective colors printed on the printing plates can be prevented.

Next another example of the method according to the invention for forming the register marks will be described.

So far the register mark forming device 4 has been described as being provided with a scribing stylus 6, but it is to be understood that instead of the scribing stylus 6, a pen (not shown) for applying an opaque ink can be provided.

Figure 6:
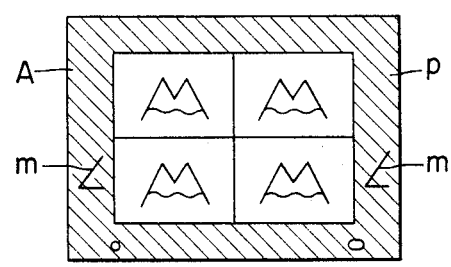

That is, after all of the patterns or images have been printed by the composer, the unexposed portion outside of the printed pattern or image portions (hatched area A in FIG. 6) is exposed. In another method in which the pen is used, prior to the exposure of this area A, the register marks m are marked with an opaque ink by the pen. The marking is carried out simultaneously with or prior to or after the printing of the pattern or image as with the case of the first example. After the area is exposed, the printing plate P with the register marks marked thereon, the patterns or images printed thereon, and the peripheral area A is developed. During the exposing step, the register marks m marked with an opaque ink are not exposed so that they remain as images during the developing step. (The photosensitive resin layers at the exposed portions are removed by a developing solution so that non-image portions of grained aluminum surface remain.) This applies to the case of a positive type printing plate. In this type, a photoresin coated over the printing plate is degraded when exposed to radiation, and the exposed areas will not remain as image areas after development.

Figure 7:
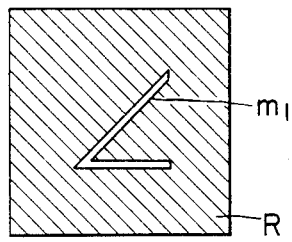
FIG. 7 is a planar view for explaining a method for forming or marking a register mark on a negative printing plate.

In case of a negative printing plate (of the type in which a photoresin which is cured or hardened when exposed to radiation is coated over the printing plate and the exposed areas will remain as image areas after development), a register mark $m_1$ is left transparent and is surrounded by a square area of an opaque ink as shown in FIG. 7. Thereafter, the area R is selectively exposed. Then the transparent ∠-shaped register mark $m_1$ is cured and remains on the printing plate.

A further example of the present invention will now be described in conjunction with FIG. 8. A register mark forming device 10 comprises a casing 11, a light source 12, a condenser lens 13, a register mark original 14, and a focusing lens 15. The top of the casing 11 is in the form of a dome and the curved interior surface 16 of this dome serves as a reflecting mirror. Light rays emitted from the light source 12 are caused to converge by the condenser lens 13 into parallel rays which are incident relative to the original 14. The original 14 comprises, as shown in FIG. 9, a substance of transparent glass, polyester film, acryl resin, styrol resin, vinyl chloride resin or the like and a ∠-shaped register mark $m_2$ of an opaque material. The method for preparing such a register mark original 14 is well known in the art of photography or printing so that no further detailed explanation shall be made in this specification.

FIG. 9 shows a register mark original 14 used in conjunction with a positive printing plate. Light rays incident on the original 14 are transmitted therethrough except the register mark $m_2$. That is, the register mark $m_2$ is a positive image which is focused on a printing plate P through the focusing lens 15.

Figure 8:
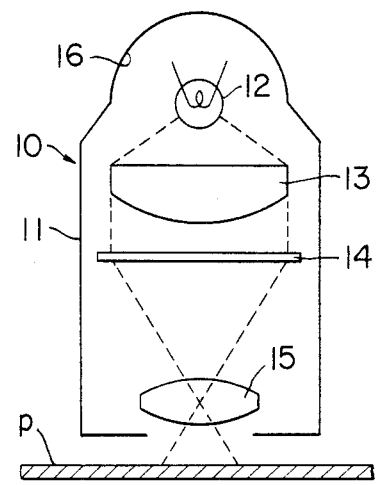
FIG. 8 is a schematic side view showing another embodiment of a register mark forming or marking device in accordance with the present invention.
Figure 9:
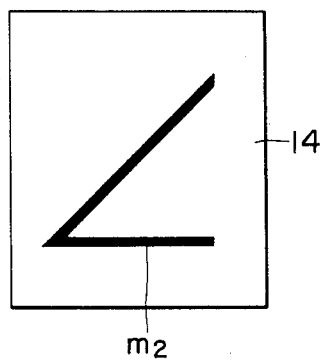
FIG. 9 is a planar view of a film original bearing a register mark.

Prior to complete exposure of the unexposed area A (See FIG. 6), the device as shown in FIG. 8 is used to transfer the image of the register mark $m_2$ (See FIG. 9) onto the printing plate P in the same manner as a pattern or image is printed. The register mark $m_2$ may be focused simultaneously with or prior to or after the printing of an image or pattern. Thereafter, the other area except the area where register marks are formed completely exposed, whereby the register mark remains as an image area on the printing plate.

Figure 10:
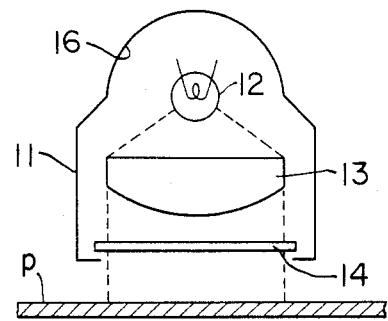
FIG. 10 is a schematic side view showing a further embodiment of a register mark forming or marking device in accordance with the present invention.

So far the marking of the register mark on a positive printing plate has been described. In the case of a negative printing plate, the substance of an original 14 is opaque while the register mark is transparent as shown in FIG. 7. However, complete exposure is not needed when a negative printing plate is prepared. In the case of a method in which a register mark original is fixed to the head of a composer and a register mark is printed on the printing plate in the same manner as an image is printed, the register mark original is placed into intimate contact with a printing plate. However, it takes some time to evacuate the space between the original and the printing plate so that the original will be in intimate contact with the printing plate. However, according to the present invention, no evacuation process is needed so that the register mark can be efficiently marked. If a focusing lens is used so that a register mark is focused on a reduced scale on the printing plate P, the quantity of light focused can be increased, so that the exposure time can be reduced. In FIG. 8, the register mark forming device is shown as incorporating the focusing lens 15, but if, as shown in FIG. 10, the register mark original 14 is disposed in the vicinity of the printing plate P, the focusing lens 15 can be eliminated. That is, as shown in FIG. 10, the register mark forming device comprises only the light source 12, the condenser lens 13 and the register mark original 14. Furthermore, the condenser lens 14 may be eliminated and any other suitable combinations of these optical elements may be used.

In FIG. 8 or 10, the light source 12 is shown as being incorporated within the casing 11, but it is to be understood that the light rays emitted from a light source of a composer can be directly used for focusing the register mark original 14 over the printing plate P. Alternatively, the light rays emitted from a light source of a composer may be redirected to the register mark forming device through a light guide consisting of mirrors and optical fibers.

So far the three examples of the present invention have been described in conjunction with a so-called multi-printing automatic composer; that is, a step-and-repeat composer, whereby a plurality of images or patterns are printed with a single film original, but it is to be understood that the present invention may be equally applied to an automatic composer of the type in which a plurality of different images or patterns are printed on a single printing film. So far the positions where register marks are marked and patterns or images are printed have been described as being designated or selected in response to data or instruction stored in a punched card, but it is to be understood that these positions may be specified in response to information stored in a magnetic disk, card or tape or a paper tape or in response to the operation of a keyboard.

Figure 11:
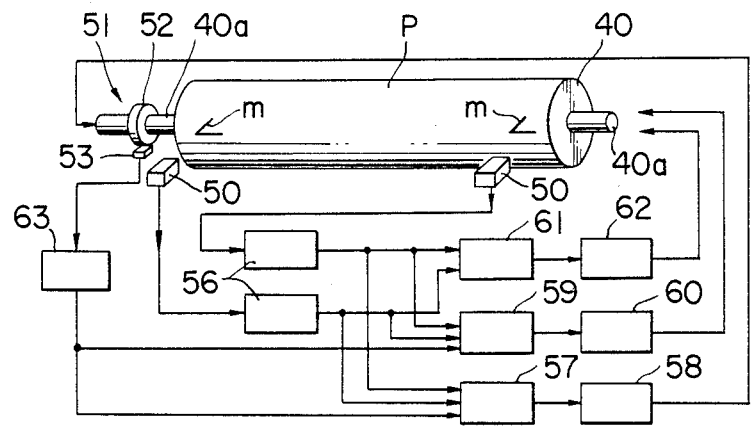
FIG. 11 is a combination of a schematic perspective view and a block diagram of a registration device of a printing press.

The printing plate upon which are marked the register marks and printed patterns or images is transferred through a post-development step to a printing step. In the printing step, the printing plate clamped around a cylinder 40 as shown in FIG. 11 and the register marks m are correctly aligned. Optical sensors 50 are disposed in confronting relationship with the cylinder 40 in order to read or sense the register marks m.

A reference-point setting device generally indicated by the reference numeral 51 is disposed adjacent to a rotary shaft 40a of the cylinder 40 and comprises a ring 52 mounted on the rotary shaft 40a for rotation in unison therewith and a sensor 53 adapted to detect whether or not the ring 50 passes past a specific reference point.

The sensor 53 is connected to a reference-point signal generator 63.

Figures 12A, 12B, 12C:
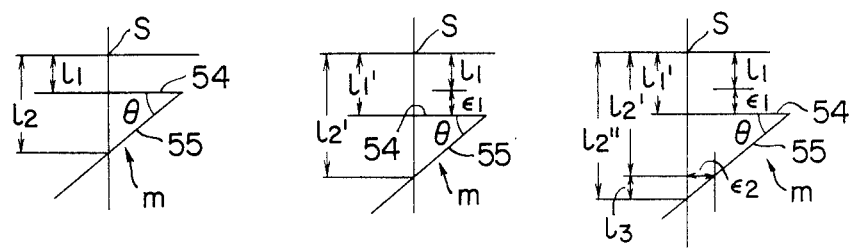
FIGS. 12($a$), ($b$) and ($c$) are diagrams for a description of the steps for correcting misregistration or misalignment between the register marks.

Each sensor 50 is adapted to measure not only the distance between a reference point S and the horizontal line 54 of the register mark m but also the distance between the reference point S and a line 55 which intersects the horizontal line 54 at an angle of $\theta$ as shown in FIG. 12. In the case of a correct registration, the distances between the reference point S on the one hand and the horizontal and inclined lines 54 and 55 on the other hand are equal for each printing plate as shown in FIG. 12(a).

If the distances are detected to be deviating from the reference distances by $\epsilon_1$ only in the vertical direction as shown in FIG. 12(b), the outputs from the sensors 50 are applied through mark detecting circuit 56 to a vertical error sensing circuit 57. In response to the output from the sensing circuit 57, a motor driving circuit 58 is driven so that the phase of rotation of the cylinder is corrected in a manner well known in the art.

If the distances are detected to be deviating from the reference distances by $\epsilon_1$ in the vertical direction and by $\epsilon_2$ in the horizontal direction, the $\epsilon_1$ is corrected in a manner substantially similar to that described above. the horizontal deviation or error $\epsilon_2$ ($=l''_2-l'_2=l''_2-l_2-\epsilon_1=l_3 \tan(90°-\theta)$) is detected by a horizontal error sensing circuit 59. The output from the circuit 59 is applied to a driving circuit 60 so that the cylinder is displaced in the horizontal direction in a manner well known in the art.

If one of the two register marks m is detected to be in the reference state as shown in FIG. 12(a) while the other register mark is found to be as shown in FIG. 12(c); that is, when the distance between the reference point S and the horizontal line 54 of one register mark is different from the distance between the reference point S and the horizontal line 54 of the other register mark, the printing plate P is detected as being twisted on the cylinder. A twisting error $[\epsilon_1+\epsilon_2$ (detected by the right sensor 50)$]-[\epsilon_1+\epsilon_2$ (detected by the left sensor 50)$]$ is detected by a twisting or torsion error sensing circuit 61. The output of the circuit 61 is applied to a driving circuit 62 which compensates for the twisting or torsion error.

Figure 13:
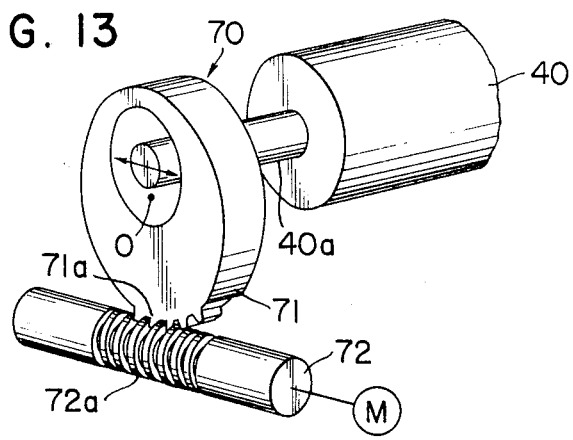
FIG. 13 is a perspective view of a cocking device.

In order to correct a twisting or torsion error, a conventional cocking device 70 as shown in FIG. 13 is used. That is, one end of a cylinder 40 is adapted to be displaced in the direction in which a printing web runs. More specifically, the rotary shaft 40a of the cylinder 40 is supported by an eccentric rotary bearing 71 which has teeth 71a in mesh with a worm gear 72a of a driving shaft 72. The driving shaft 72 is rotated in response to the output from the circuit 62 (See FIG. 11) so that the eccentric rotary bearing 71 rotates about its axis O and consequently the axis of the cylinder 40 is slightly displaced in the above direction. This displacement causes the change of contacting of line of the cylinder 40 and a blanket cylinder (not shown). This displacement is undesirable from the standpoint of the construction of a printing press. Therefore the correction is limited within ±0.3 mm.

After the correction, the register marks m are read again, and if the correction is not satisfactory, the correction signal is generated again. Thus a feedback system is used to correct a twisting or torsion error.

Therefore even though the printing plates are clamped around the cylinders, the registration can be attained without carrying out printing. That is, the registration can be achieved by merely rotating the cylinders with the printing plates clamped therearound without feeding sheets or web.

So far the reference point S has been described as being established by the reference-point signal generator 63 (See FIG. 11), but it is to be understood that a signal generated when the horizontal line of the ∠-shaped register mark is detected can be used as a reference signal.

In the case of a rotary printing press, multicolor registration in the vertical direction can be accomplished automatically by reading the multicolor register marks printed at the margins of printing sheets or the like by optical sensors. The multicolor register marks are printed or otherwise formed with reference to the register marks formed on the printing plates.

Since, the register marks can maintain a specific positional relationship with a pattern or image, the multicolor register marks also can maintain a specific positional relationship with the pattern or image.

In summary, according to the present invention, the register marks, which are used for automatic registration on a printing press, can be marked at a specific position with respect to a pattern or image without causing a decrease in efficiency of a composer. Thus precise registration can be achieved.

What is claimed is:

1. A method for forming or marking register marks for an automatic registration between a plurality of printing plates in a printing press, which comprises mounting a register mark forming device on a printing head of a composer which is provided with a printing frame so as to move in unison with the printing frame to any position over a table of the composer and forming register marks on the printing plates without mounting any film original bearing a register mark for carrying out the automatic registration directly on the printing frame in which, for each printing plate, the film original bearing pattern images mounted on the printing frame is printed on said printing plate clamped over a table of the composer.

2. A method for forming or marking register marks as set forth in claim 1 wherein each register mark is formed or marked on said printing plate by cutting or grinding the surface of said printing plate.

3. A method for forming or marking register marks as set forth in claim 2 wherein each register mark is formed or marked by means of a scribing stylus.

4. A method for forming or marking register marks as set forth in claim 1 wherein each register mark is formed or marked by applying as coating a substance which is opaque to the radiation onto an unexposed area of said printing plate.

5. A method for forming or marking register marks as set forth in claim 1 wherein the image of a register mark is projected and printed over an unexposed area of said printing plate, whereby each register mark is formed or marked.

* * * * *